US006388787B1

(12) United States Patent
Bischoff

(10) Patent No.: US 6,388,787 B1
(45) Date of Patent: May 14, 2002

(54) METHOD FOR GENERATING AN OPTICAL FREQUENCY REFERENCE SIGNAL

(75) Inventor: Mathias Bischoff, München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/269,690

(22) PCT Filed: Sep. 24, 1997

(86) PCT No.: PCT/DE97/02170

§ 371 Date: Mar. 30, 1999

§ 102(e) Date: Mar. 30, 1999

(87) PCT Pub. No.: WO98/15074

PCT Pub. Date: Apr. 9, 1998

(30) Foreign Application Priority Data

Sep. 30, 1996 (DE) .......................... 196 40 292

(51) Int. Cl.⁷ ............................................. H04B 10/04

(52) U.S. Cl. ........................................ 359/187; 359/188

(58) Field of Search ................................ 359/158, 162, 359/187, 188; 372/96, 32

(56) References Cited

U.S. PATENT DOCUMENTS

| | | | |
|---|---|---|---|
| 4,926,429 A | 5/1990 | Chung | 372/32 |
| 4,932,030 A | 6/1990 | Chung | 372/32 |
| 5,396,361 A | 3/1995 | Sasaki et al. | 359/189 |
| 5,400,167 A | 3/1995 | Suemura | 359/194 |

OTHER PUBLICATIONS

Fischer et al., "Absorption Spectra of Excited Kr 84 States Between 1.5 and 1.58 μm and Their Use for Absolute Frequency Locking", Journal of Lightwave Technology, vol. 14, No. 2, 1996, pp. 139–143.

Chung et al., "Standardization of Optical Frequencies for WDM Networking Applications", Spie vol. 2378, pp. 230–235.

Zhu et al., "Short and Long Term Stability of Optical Oscillators", 1992 IEEE Frequency Control Symposium, pp. 44–55.

Madej et al., "Absolute heterodyne frequency measurement of the 88Sr+ 455–Thz S–D single ion transition", Optics Letters, vol. 21, No. 11, Jun. 1996, pp. 824–826.

Guy et al., "Simultaneous Absolute Frequency Control of Laser Transmitters in both 1.3 and 1.55 μm Bands for Multiwavelength Communication Systems", Journal of Lightwave Technology, vol. 14, No. 6, Jun. 1996, pp. 1136–1143.

*Primary Examiner*—Leslie Pascal
*Assistant Examiner*—Dalzid Singh
(74) *Attorney, Agent, or Firm*—Schiff Hardin & Waite

(57) ABSTRACT

A first optical signal is generated via a first laser diode on which a low-frequency signal of small amplitude is superimposed. The first optical signal is conducted through a gas-filled galvanotron and the low-frequency signal emerges at two terminals of the galvanotron. The low-frequency signal is fed to a synchronous detector and emits a first output signal for generating a control signal. The first laser diode is controlled via the control signal and the low-frequency signal, the first optical signal passes through the gas-filled galvanotron and represents a first frequency reference signal. A second optical signal is generated via a second laser diode and emits the second optical signal via a first fiber-optic directing coupler to a signal output and to a second fiber-optic directing coupler. A microwave signal is generated by combining the second optical signal and the first frequency reference signal via an opto-electronic converter. The microwave signal is fed to a frequency control loop subsequent to opto-electric conversion and mixes the microwave signal with a quartz-based frequency synthesizer signal for generating a difference low-frequency signal. A phase comparison is provided of a signal of the quartz oscillator and the difference low-frequency signal resulting in a second output signal for generating a control signal for the second laser diode.

5 Claims, 1 Drawing Sheet

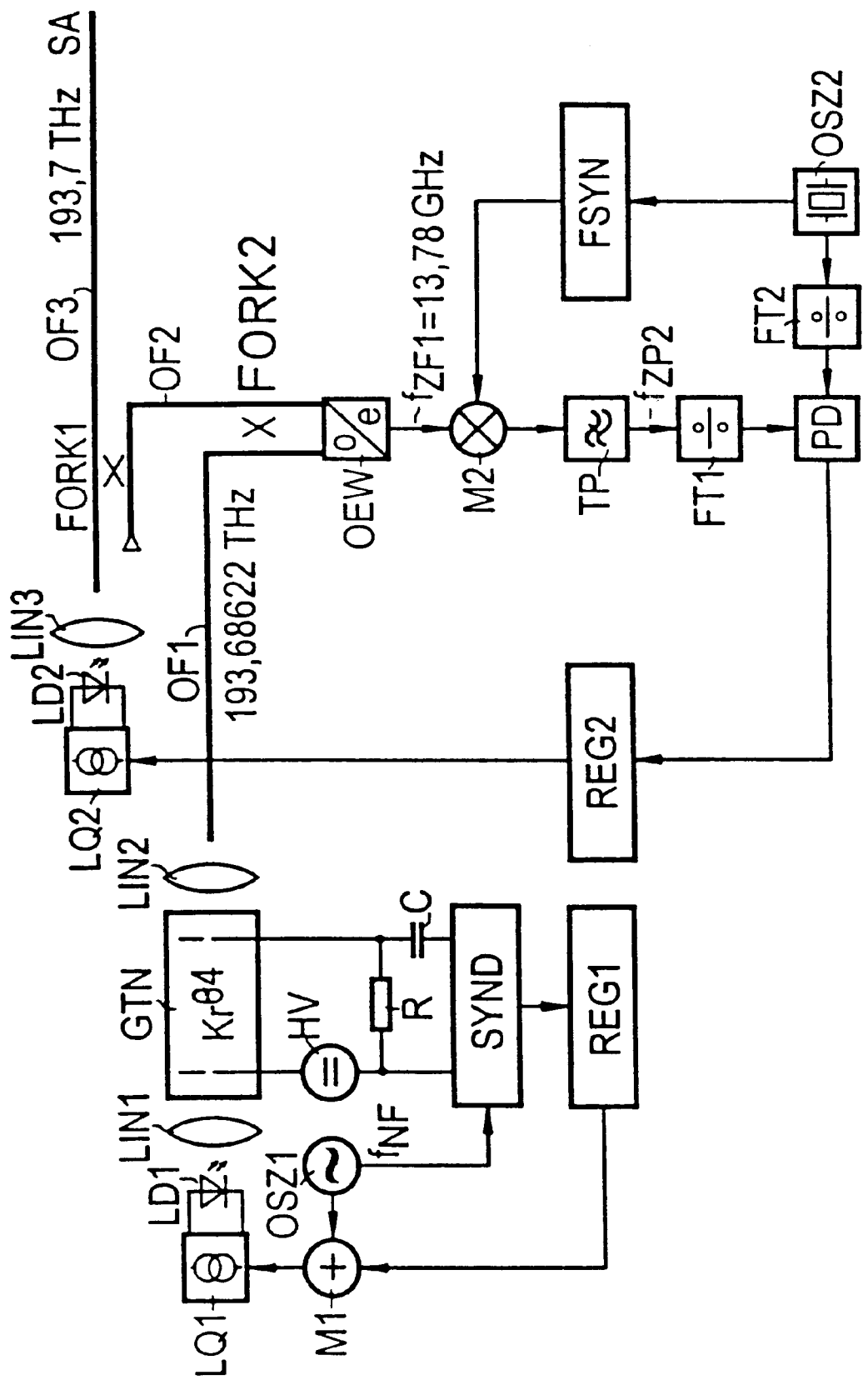

METHOD FOR GENERATING AN OPTICAL FREQUENCY REFERENCE SIGNAL

BACKGROUND OF THE INVENTION

1. Field of the Invention

The present invention relates to a method for generating a frequency reference signal particularly for a wavelength-division multiplex operation, and to an arrangement for executing the method.

2. Description of the Related Art

The continuously growing bandwidth requirement in telecommunications can be satisfied in the core network by applying wavelength-division multiplexing. This technique enables a better exploitation of the inherent transmission bandwidths of light waveguides based on quartz glass than the single-channel transmission common today. Light sources which emit their light at a prescribed frequency with a high degree of precision and optical filters whose transmission function is adapted to the selected channel raster are preconditions of a successful application of the wavelength-division multiplex technique. Since the properties of both laser diodes a employed as light sources, and suitable optical filters are dependent on temperature and undergo aging processes, it is a requirement to check the frequency precision and, given the great demands of the wavelength-division multiplex technique, control the emission frequency of laser diodes or the midband frequency of the optical filter. Automatic transitions, or molecular resonances of the krypton 84 isotope, of ammonia, acetylene, or hydrocyanic acid, in particular, are used for this, in view of the high precision of the frequency reference (Chung, Y C, Clark, L, Fan, C, "Standardization of Optical Frequencies for WDM Networking Applications," *Laser Frequency Stabilization and Noise Reduction*, 1995; SPIE, Vol. 2378 (Int. Soc. Opt. Eng., San Jose: 230–235)). The transition between $1s^2$ and $2p^8$ of the krypton 84 isotope, which corresponds to a frequency of 193.68622 THz, is considered particularly suitable for the synthesis of a frequency reference in the third optical window, i.e. at 1550 nm. The article "Absorption Spectra of Excited Kr84 States Between 1.5 and 1.58 $\mu$m and Their Use for Absolute Frequency Locking" (von Helmolt, C., *J. Lightwave Techn.*, Fischer, U.H.P.; Vol 14, No. 2 (1996):139–143) described an arrangement in which the collimated beam of a laser diode LD1 is directed through of a galvanotron which is filled with krypton 84, which galvanotron is connected to a high-voltage source via a resistor. The laser diode is modulated with a signal of small amplitude and low frequency, a synchronous signal thereby emerging at the resistor, from which signal a control signal is derived by means of synchronous detection, which control signal adjusts the emission frequency of the laser diode to the value of the atomic transition, thereby generating a first reference signal. However, a problem derives in that the reference signal does not fit into the channel raster recommended by the ITU-T ("International Telecommunication Union-Telecommunication Standardization Section").

SUMMARY OF THE INVENTION

It is an object of the Invention to provide a method and an arrangement for generating an optical frequency reference signal which lies in the ITU raster.

This object is achieved by providing a method and an arrangement in which a method includes the steps of generating a first optical signal via a first laser diode in which a low-frequency signal of small amplitude is superimposed on the first optical signal, conducting the first optical signal through a gas-filled galvanotron, the low-frequency signal emerging at two terminals of the galvanotron, feeding the low-frequency signal to a synchronous detector and emitting a first output signal for generating a control signal, controlling the first laser diode via the control signal and the low-frequency signal, wherein the first optical signal passing through the gas-filled galvanotron represents a first frequency reference signal, generating a second a optical signal via a second laser diode, emitting the second optical signal via a first fiber-optic directing coupler to a signal output and to a second fiber-optic directing coupler, generating a microwave signal by combining the second optical signal and the first frequency reference signal via an opto-electronic converter, feeding the microwave signal to a frequency control loop subsequent to opto-electric conversion and mixing the microwave signal with a quartz-based frequency synthesizer signal for generating a difference low-frequency signal, and providing a phase comparison of a signal of a quart oscillator and the difference low-frequency signal resulting in a second output signal for generating a control signal for the second laser diode.

In an embodiment of the invention in which the microwave signal is a first microwave signal, the method further includes the steps of controlling the output of the second laser diode by generating the second optical signal that is within a preselected frequency channel raster, and generating a second microwave signal that differs from the first microwave signal by a few 100 MHZ.

In an embodiment of the present invention a circuit arrangement is provided for generating a frequency reference signal that includes a sub-circuit for producing a first frequency reference signal, the sub-circuit has a first oscillator, a synchronous detector, a first controller, an adder, a first laser diode, a galvanotron, and first and second lens, wherein the first oscillator has a first output connected to a first input of the synchronous detector and the second output connected to a first output of the adder generates a low-frequency signal, the synchronous detector also has second and third inputs connected to the galvanotron via a high voltage source, a capacitor and a resistor and an output connected to the first controller, the first controller having an output connected to a second input of the adder generates an output signal to the adder, the adder generates a control signal to the first laser diode via a first laser diode current source, the first laser diode, galvanotron and first and second lens connect to form a light path that outputs the first frequency reference signal. The circuit arrangement also includes a second current source, a second laser diode that is connected to the second current source in which the second laser diode generates an output light, a third lens, a first fiber-optic directing coupler that receives the output light via the third lens the first fiber-optic directing coupler also has a first input and first and second outputs, the first output is connected to a signal output via a third optical fiber, a second fiber-optic directing coupler having first and second inputs, the first input being coupled to the second lens via a first optical fiber, the second input connected to the second output of the first fiber-optic directing coupler via a second optical fiber, an opto-electronic converter connected to the second fiber-optic directing coupler, the opto-electronic converter has an output and generates a first microwave signal, a modulator having first and second signal inputs and an output in which the first signal input is connected to the output of the opto-electronic converter, a frequency synthesizer has an input and an output that is connected to the second signal input the frequency synthesizer generates a second microwave signal, a quartz oscillator has first and second outputs in which the first output is connected to the input of the frequency synthesizer, a first frequency divider includes an input that is connected to the modulator via a low pass filter, the first frequency divider also having an output, a phase detector included first and second inputs and an output in which the first input is connected to the output of the first frequency divider, a second frequency divider has an input connected to the quartz oscillator and an output connected to the second input of the phase detector, and a second controller that has an input connected to the output of the phase detector and an output connected to the second current source, wherein the second controller generates a control signal to the second current source and the second laser diode generates a second frequency reference signal.

In an embodiment, the circuit arrangement includes connections via the first, second and third optical fibers to and from the first and second fiber-optic directing couplers maintain polarization.

In an embodiment, the circuit arrangement the first and second laser diodes are DFB lasers.

It is an advantage of the invention to operate only a few components in the microwave region, while the majority are passed only by a signal with a considerably lower frequency.

The invention is detailed below with the aid of an exemplifying embodiment.

DETAILED DESCRIPTION OF THE DRAWINGS

FIG. 1 is a schematic diagram of an arrangement for the generation of a frequency reference signal at a frequency of 193.7 THz, which lies in the recommended frequency raster of the ITU-T.

DETAILED DESCRIPTION OF THE PRESENTLY PREFERRED EMBODIMENTS

FIG. 1 depicts an arrangement for generating a frequency reference signal, consisting of a (e.g. a sub-circuit) which is known per se, with a first laser diode LD1, a galvanotron GTN and a connected control circuit, as well as a right part, in which a frequency reference signal which lies in the frequency channel raster recommended by the ITU-T is generated from the output light of the galvanotron.

In the left part, the output light of a first laser diode LD1, which is connected to a first laser diode source LQ1, is fed in collimated form into a galvatron GTN, which is filled with the krypton isotope $Kr^{84}$, via a first lens LIN1. Instead of the krypton isotope, ammonia, acetylene, hydrocyanic acid or other substances can be incorporated. A signal in the range of 1 to 100 KHz, thus a relatively low-frequency signal, is generated by a first oscillator OSZ1 and emitted to a synchronous detector SYND and an adder M1, in which the low-frequency signal is superimposed by a control signal generated by a first controller REG1 and emitted to the first laser current source LQ1. The low-frequency oscillation then arises in the light of the first laser diode LD1 as well as the terminals of the galvanotron GTN, the terminals being connected to a high-voltage source directly, or via a resistor, and also to signal inputs of the synchronous detector SYND via the high-voltage source and a capacitor C. The output of the synchronous detector SYND is connected to an input of the first controller REG1, resulting in an overall control loop. The synchronous signal pending at the galvanotron terminals, which is detected by means of synchronous detection, serves for the adjustment of the emission frequency of the first laser diode LD1 to the value of the atomic transition of the krypton isotope $Kr^{84}$, so that a light signal is conducted into a coupled first optical fiber OF1 via a second lens LIN2, which signal represents a reference signal with the frequency 193.68622 THz. A second reference signal is generated in the connecting assemblies on the basis of this first reference signal.

To generate the second frequency reference signal, which fits into the channel raster of the ITU-T in terms of frequency, from the first frequency reference signal, a second laser diode LD2 is provided. The second laser diode LD2 is supplied by a second laser current source LQ2 and emits its light to one input of a first fiber-optical directing coupler FORK1 via a third lens LIN3 and a signal output SA via a third optical fiber OF3. The second input of the first fiber-optical directing coupler FORK1 remains free, while the second output is connected to the second input of a second fiber-optical directing coupler via a second optical fiber OF2. The first input of this second fiber-optical directing coupler FORK2 is coupled to the second lens LIN2 and thereby takes over the light originating from the galvanotron GTN, which light represents the first frequency reference signal. In the second fiber-optical directing coupler FORK2, a superposition occurs from the light waves originating from the first and the second laser diodes LD1, LD2. The difference in frequency between the light of the first laser diode LD1 having a frequency of 193.68622 THz and the light of the second laser diode LD2 having a frequency of 193.7 THz, represents a microwave signal with a frequency of 13.78 GHz. Given the conducting of both light beams to an opto-electronic converter OEW, the microwave signal is emitted by the opto-electronic converter to one input of a modulator M2.

To avoid problems of polarization fluctuations or to keep the converter simple, i.e. to make do without a polarization diversity receiver, the utilized optical fibers OF1, OF2, OF3 preferably maintain polarization.

The second input of the modulator M2 is connected to the output of a frequency synthesizer FSYN. The frequency synthesizer FSYN receives a ground signal from a quartz oscillator OSZ2 and generates a microwave signal. The microwave signal is mixed with the output signal (also a microwave signal), of the opto-electronic converter OEW, i.e. with the first intermediate frequency signal. The output signal (or second frequency difference signal) of the modulator M2 or the mixer M2 reaches one input of a phase detector PD via a low-pass filter TP and a downstream first frequency divider FT1. The other input of the phase detector PD is connected to the output of a second frequency divider FT2, which subdivides the output signal of the quartz oscillator OSZ2. In the phase detector PD, a phase comparison occurs between the second frequency difference signal generated by the mixer M2, and the output signal of the second frequency divider FT2 as another reference signal. First and second frequency dividers FT1, FT2 have a relatively high divider factor, which, in addition to the more simple processing of the output signal, averages out the intense phase noises which are common in laser diodes. The output of the phase detector PD is connected to the input of a second controller REG2. The second generates a control signal for the second laser current supply LQ1, and thus for the second laser diode LD2. The error signal lying adjacent at the output of the phase detector PD is converted in the controller such that the emission frequency of the second laser diode LD2 is adjusted, accordingly, and the diode generates a second frequency reference signal with the precision of the atomic transition of the gas utilized in the galvanotron GTN, given an equivalent position in the channel raster recommended by the ITU.

DFB lasers were used for the first and second laser diodes LD1, LD2. Measures for guaranteeing a disturbance-free operation of the laser diodes, such as optical insulators and temperature stabilizations, were omitted from FIG. 1 for purposes of clarity.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for generating an optical frequency for a wavelength-division multiplex operation, comprising the steps of:

generating a first optical signal via a first laser diode on which a low-frequency signal of small amplitude is superimposed;

conducting the first optical signal through a gas-filled galvanotron, the low-frequency signal emerging at two terminals of the galvanotron;

feeding the low-frequency signal to a synchronous detector and emitting a first output signal for generating a control signal;

controlling the first laser diode via the control signal and the low-frequency signal, wherein the first optical signal passing through the gas-filled galvanotron represents a first frequency reference signal;

generating a second optical signal via a second laser diode, emitting the second optical signal via a first fiber-optic directing coupler to a signal output and to a second fiber-optic directing coupler;

generating a microwave signal by combining the second optical signal and the first frequency reference signal via an opto-electronic converter, feeding the microwave signal to a frequency control loop subsequent to opto-electric conversion and mixing the microwave signal with a quartz-based frequency synthesizer signal for generating a difference low-frequency signal; and providing a phase comparison of a signal of a quartz oscillator and the difference low-frequency signal resulting in a second output signal for generating a control signal for the second laser diode.

2. The method of claim 1 wherein the microwave signal is a first microwave signal, the method further comprising the steps of:

controlling the output of the second laser diode by generating the second optical signal that is within a preselected frequency channel raster; and generating a second microwave signal that differs from the first microwave signal by a few 100 MHZ.

3. A circuit arrangement for generating a frequency reference signal, comprising:

a sub-circuit for producing a first frequency reference signal, the sub-circuit including a first oscillator, a synchronous detector, a first controller, an adder, a first laser diode, a galvanotron, and first and second lens, the first oscillator having first output connected to a first input of the synchronous detector and a second output connected to a first input of the adder and generating a low-frequency signal, the synchronous detector having a second input and a third input connected to the galvanotron via a high voltage source, a capacitor and a resistor and an output connected to the first controller, the first controller having an output connected to a second input of the adder and generating an output signal to the adder, the adder generating a control signal to the first laser diode via a first laser diode current source, the first laser diode, galvanotron and first and second lens being connected to form a light path that outputs the first frequency reference signal;

a second current source;

a second laser diode connected to the second current source, the second laser diode generating an output light;

a third lens;

a first fiber-optic directing coupler which receives the output light via the third lens, the first fiber-optic directing coupler having a first input and first and second outputs, the first output connected to a signal output via a third optical fiber;

a second fiber-optic directing coupler having first and second inputs, the first input being coupled to the second lens via a first optical fiber, the second input connected to the second output of the first fiber-optic directing coupler via a second optical fiber;

an opto-electronic converter connected to the second fiber-optic directing coupler, the opto-electronic converter having an output generates a first microwave signal;

a modulator having first and second signal inputs and an output, the first signal input connected to the output of the opto-electronic converter;

a frequency synthesizer having an input and an output connected to the second signal input, the frequency synthesizer generates a second microwave signal;

a quartz oscillator having first and second outputs, the first output connected to the input of the frequency synthesizer;

a first frequency divider having an input connected to the modulator via a low pass filter, and an output;

a phase detector having first and second inputs and an output the first input connected to the output of the first frequency divider;

a second frequency divider having an input connected to the quartz oscillator and an output connected to the second input of the phase detector; and a second controller having an input connected to the output of the phase detector and an output connected to the second current source, wherein the second controller generates a control signal to the second current source and the second laser diode generates a second frequency reference signal.

4. The circuit arrangement of claim 1, wherein the connections via the first, second and third optical fibers to and from the first and second fiber-optic directing couplers maintain polarization.

5. The circuit arrangement of claim 1, wherein the first and second laser diodes are DFB lasers.

* * * * *